US012615759B2

(12) United States Patent
Liao et al.

(10) Patent No.: US 12,615,759 B2
(45) Date of Patent: Apr. 28, 2026

(54) SEMICONDUCTOR STRUCTURE AND METHOD FOR FORMING THE SAME WITH MULTIPLE GATE CONDUCTIVE LAYERS HAVING DIFFERENT CHARACTERISTICS

(71) Applicant: CXMT Corporation, Hefei (CN)

(72) Inventors: Yu-Cheng Liao, Hefei (CN); Wenjie Liu, Hefei (CN); Joonsuk Moon, Hefei (CN)

(73) Assignee: CXMT Corporation, Hefei (CN)

( * ) Notice: Subject to any disclaimer, the term of this patent is extended or adjusted under 35 U.S.C. 154(b) by 559 days.

(21) Appl. No.: 18/162,818

(22) Filed: Feb. 1, 2023

(65) Prior Publication Data

US 2024/0074143 A1 Feb. 29, 2024

Related U.S. Application Data

(63) Continuation of application No. PCT/CN2022/117852, filed on Sep. 8, 2022.

(30) Foreign Application Priority Data

Aug. 30, 2022 (CN) .......................... 202211045210.3

(51) Int. Cl.
*H10B 12/00* (2023.01)
*H10D 30/67* (2025.01)
(52) U.S. Cl.
CPC ............. *H10B 12/30* (2023.02); *H10B 12/05* (2023.02); *H10D 30/6735* (2025.01)

(58) Field of Classification Search
CPC .... H10B 12/053; H10B 12/34; H10D 64/512; H10D 64/513; H10D 64/517
See application file for complete search history.

(56) References Cited

U.S. PATENT DOCUMENTS

| | | | |
|---|---|---|---|
| 8,962,463 B2 | 2/2015 | Ji | |
| 9,196,655 B2 | 11/2015 | Park | |
| 9,230,963 B2 | 1/2016 | Ji | |
| 9,419,055 B2 | 8/2016 | Park | |
| 9,431,461 B2 | 8/2016 | Park | |
| 10,741,643 B2 | 8/2020 | Ryu | |
| 11,177,366 B2 | 11/2021 | Reznicek | |

(Continued)

FOREIGN PATENT DOCUMENTS

| | | |
|---|---|---|
| CN | 103904029 A | 7/2014 |
| CN | 104009082 A | 8/2014 |

(Continued)

OTHER PUBLICATIONS

First Office Action of the Chinese application No. 202211045210.3, issued on Oct. 11, 2022, 22 pages.

(Continued)

*Primary Examiner* — Nelson Garces
(74) *Attorney, Agent, or Firm* — Syncoda LLC; Feng Ma

(57) ABSTRACT

Provided is a semiconductor structure and a formation method therefor. The semiconductor structure includes: a gate structure located on a substrate. The gate structure includes at least two gate conductive layers; the at least two gate conductive layers have the same components and different characteristic parameters; and the characteristic parameter includes at least one of thickness, component content or shape.

18 Claims, 7 Drawing Sheets

(56) References Cited

U.S. PATENT DOCUMENTS

| | | | |
|---|---|---|---|
| 11,239,118 B2 | 2/2022 | Kim | |
| 11,315,930 B2 | 4/2022 | Huang et al. | |
| 2011/0018057 A1 | 1/2011 | Kim | |
| 2014/0001565 A1 | 1/2014 | Hyu | |
| 2014/0187030 A1 | 7/2014 | Ji | |
| 2014/0239247 A1 | 8/2014 | Park | |
| 2015/0137257 A1 | 5/2015 | Ji | |
| 2015/0171143 A1 | 6/2015 | Park | |
| 2016/0043139 A1 | 2/2016 | Park | |
| 2016/0049446 A1 | 2/2016 | Park | |
| 2017/0186844 A1 | 6/2017 | Kim et al. | |
| 2017/0256609 A1* | 9/2017 | Bhuwalka | H10D 30/43 |
| 2018/0190661 A1 | 7/2018 | Wang | |
| 2021/0082767 A1 | 3/2021 | Kim | |
| 2021/0217876 A1 | 7/2021 | Reznicek | |
| 2022/0005941 A1 | 1/2022 | Reznicek | |
| 2022/0028867 A1 | 1/2022 | Chou | |
| 2022/0122888 A1 | 4/2022 | Kim | |

FOREIGN PATENT DOCUMENTS

| | | |
|---|---|---|
| CN | 108257959 A | 7/2018 |
| CN | 110190054 A | 8/2019 |
| CN | 112599411 A | 4/2021 |
| CN | 113270406 A | 8/2021 |
| CN | 114927567 A | 8/2022 |
| JP | 2009026972 A | 2/2009 |

OTHER PUBLICATIONS

International Search Report in the international application No. PCT/CN2022/117852, mailed on May 6, 2023. 3 pages.

* cited by examiner

SEMICONDUCTOR STRUCTURE AND METHOD FOR FORMING THE SAME WITH MULTIPLE GATE CONDUCTIVE LAYERS HAVING DIFFERENT CHARACTERISTICS

CROSS-REFERENCE TO RELATED APPLICATION

This is a continuation of International Application No. PCT/CN2022/117852, filed on Sep. 8, 2022, which is based on and claims priority to Chinese Patent Application No. 202211045210.3, filed on Aug. 30, 2022, and entitled "SEMICONDUCTOR STRUCTURE AND METHOD FOR FORMING THE SAME". The contents of International Application No. PCT/CN2022/117852 and Chinese Patent Application No. 202211045210.3 are hereby incorporated herein by reference in their entireties.

TECHNICAL FIELD

The present disclosure relates to the semiconductor technology field, and relates to, but is not limited to, a semiconductor structure and a method for forming the same.

BACKGROUND

As sizes of Dynamic Random Access Memory (DRAM) memory units become smaller and smaller, the length of the gate channel also shrinks. In this way, the Gate Induced Drain Leakage (GIDL) becomes larger and larger, and the control ability of the gate is also gradually weakened.

SUMMARY

In view of this, the embodiments of the present disclosure provide a semiconductor structure and a method for forming the same.

In the first aspect, the embodiments of the present disclosure provide a semiconductor structure, comprising: a gate structure located on a substrate. The gate structure comprises at least two gate conductive layers. The at least two gate conductive layers have same components and different characteristic parameters; and the characteristic parameters comprise at least one of thickness, component content or shape.

In the second aspect, the embodiments of the present disclosure provide a method for forming a semiconductor structure, comprising: providing a substrate; and forming at least two gate conductive layers on the substrate to form a gate structure; wherein the at least two gate conductive layers have same components and different characteristic parameters; and the characteristic parameter comprises at least one of thickness, component content or shape.

BRIEF DESCRIPTION OF THE DRAWINGS

In the accompanying drawings (which are not necessarily drawn to scale), similar reference numerals may describe similar components in different views. Similar reference numerals with different letter suffixes may represent different examples of similar components. The accompanying drawings generally show the various embodiments discussed herein by way of example rather than limitation.

DETAILED DESCRIPTION

Figure 1:
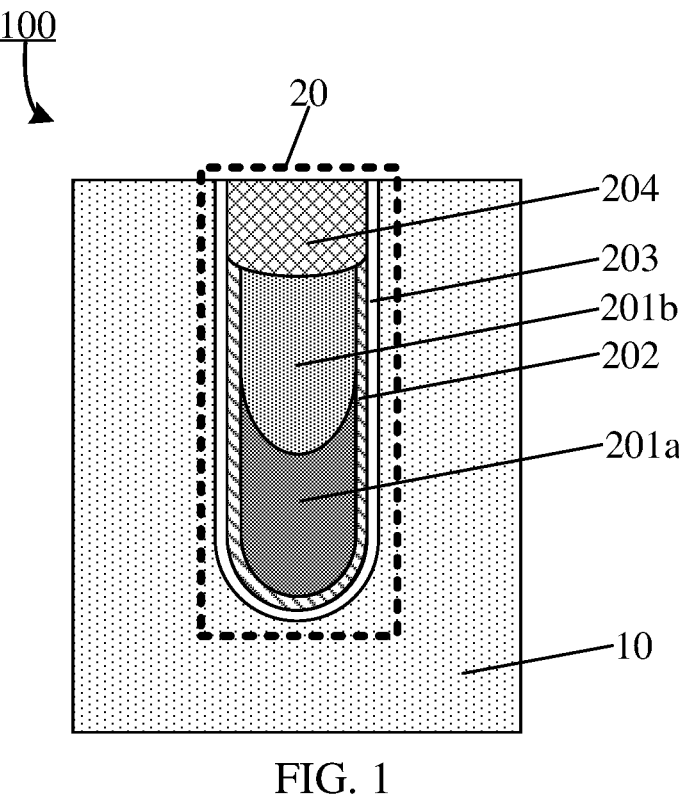
FIG. 1 is a structural diagram of a semiconductor structure according to an embodiment of the present disclosure.

Exemplary implementations of the present disclosure will be described in more detail below with reference to the accompanying drawings. Although the exemplary implementations of the present disclosure are shown in the accompanying drawings, it should be understood that the present disclosure can be implemented in various forms, and should not be limited by the specific implementations illustrated herein. On the contrary, these implementations are provided to enable a more thorough understanding of the present disclosure, and to fully communicate the scope of the present disclosure to those skilled in the art.

In the following description, a large amount of details are given in order to provide a more thorough understanding of the present disclosure. However, it will be apparent to those skilled in the art that the present disclosure can be implemented without one or more of these details. In other examples, in order to avoid confusion with the present disclosure, some technical features known in the art are not described. That is, not all the features of the actual embodiments are described here, and well-known functions and structures are not described in detail.

In the accompanying drawings, the sizes of layers, regions, elements and their relative sizes may be exaggerated for clarity. The same reference numerals throughout represent the same elements.

It should be understood that when an element or layer is referred to as "on . . . ", "adjacent to . . . ", "connected to . . . " or "coupled to . . . " other elements or layers, it can be directly on, adjacent to, connected to or coupled to other elements or layers, or there may be an intervening element or layer. On the contrary, when an element is referred to as "directly on . . . ", "directly adjacent to . . . ", "directly connected to . . . " or "directly coupled to . . . " other elements or layers, there are no intervening elements or layers. It should be understood that although the terms first, second, third, etc. can be used to describe various elements, components, regions, layers and/or parts, these elements, components, regions, layers and/or parts should not be restricted by these terms. These terms are only used to distinguish one element, part, region, layer or part from another element, component, region, layer or part. Therefore, without departing from the teachings of the present disclosure, the first element, component, region, layer or part discussed below can be represented as a second element, component, region, layer or part. When a second element, component, region, layer or part is discussed, it does not mean that there must be a first element, component, region, layer or part in the present disclosure.

The terms used herein are intended only to describe specific embodiments and are not a limitation of the present disclosure. As used herein, the singular forms of "a", "one" and "the/said" are also intended to include the plural form, unless the context clearly indicates otherwise. It should also be understood that the terms "composing" and/or "including", when used in this specification, determine the existence of the feature, integer, step, operation, element and/or component, but do not exclude the existence or addition of one or more other features, integers, steps, operations, elements, components and/or groups. As used herein, the term "and/or" includes any and all combinations of items listed in relation thereto.

The embodiments of the present disclosure provide a semiconductor structure. FIG. 1 is a structural diagram of a semiconductor structure according to an embodiment of the present disclosure. As shown in FIG. 1, the semiconductor structure 100 includes: a gate structure 20 located on a substrate 10. The gate structure 20 includes at least two gate conductive layers. The at least two gate conductive layers have the same components and different characteristic parameters. The characteristic parameters include at least one of thickness, component content or shape.

In some embodiments, the substrate can be a silicon substrate, and the substrate can also include other semiconductor elements, e.g., germanium (Ge), or include semiconductor compounds, e.g., silicon carbide (SiC), gallium arsenide (GaAs), gallium phosphide (GaP), indium phosphide (InP), indium arsenide (InAs), or indium antimonide (InSb), or include other semiconductor alloys, e.g., silicon germanium (SiGe), gallium arsenide phosphide (GaAsP), indium aluminum arsenide (AlInAs), aluminum gallium arsenide (AlGaAs), indium gallium arsenide (GaInAs), indium gallium phosphide (GaInP), and/or indium gallium arsenide phosphate (GaInAsP), or a combination thereof. In other embodiments, the substrate can also be an N-type doped substrate or a P-type doped substrate.

In the embodiments of the present disclosure, the gate structure 20 includes at least two gate conductive layers, for example, the gate structure 20 may include 2 layers, 3 layers, 5 layers, 6 layers or more layers. In the embodiments of the present disclosure, by collocation of multi-layer gate conductive layers and adjustment of the composition and concentration changes among the gate conductive layers, the threshold voltages (Vt) of the gate structure at different positions in the substrate and the work function of the gate structure can be effectively adjusted. Thus, the gate induced drain leakage (GIDL) can be improved, which can adapt to the smaller and smaller size of semiconductor memory devices, and has higher efficiency and higher density. Further, in a specific embodiment, for example, the gate conductive layer is composed of a nitrogen component and a metal component. For example, tungsten (W), cobalt (Co), titanium (Ti), tantalum (Ta), can be selected as the metal component in the gate conductive layer. The content or concentration of nitrogen component is different in gate conductive layers, so that the carrier concentration in the metal component is different in different gate conductive layers. Therefore, the concentration of the nitrogen component can be adjusted to change the resistance value and work function.

Further referring to FIG. 1, the gate structure 20 includes, for example, two gate conductive layers, i.e., a first gate conductive layer 201a and a second gate conductive layer 201b. The components of the first gate conductive layer 201a and the second gate conductive layer 201b are the same. For example, both the first gate conductive layer 201a and the second gate conductive layer 201b may be titanium nitride, or the first gate conductive layer 201a and the second gate conductive layer 201b may be titanium-containing metal layers, each of which may be a composite layer of a titanium nitride layer and a metallic titanium layer.

In the embodiments of the present disclosure, since the components of the first gate conductive layer 201a and the second gate conductive layer 201b are the same, but the thicknesses of the first gate conductive layer 201a and the second gate conductive layer 201b are different, or the component contents (such as Ti content, N content) of the first gate conductive layer 201a and the second gate conductive layer 201b are different, or the shapes of the first gate conductive layer 201a and the second gate conductive layer 201b are different (for example, the surface of the first gate conductive layer 201a is an arc shape, and the surface of the second gate conductive layer 201b is a planar shape and an arc shape), the work functions of the first gate conductive layer 201a and the second gate conductive layer 201b are caused to be adjustable, thus making the threshold voltage of the gate structure in the embodiments of the present disclosure adjustable. Therefore, it can effectively reduce the gate induced drain leakage current of the semiconductor structure and improve the retention performance of the semiconductor structure.

In some embodiments, further referring to FIG. 1, the gate structure 20 further includes a first gate dielectric layer 203 and a second gate dielectric layer 202; and the second gate dielectric layer 202 is located between the gate conductive layer (i.e. the first gate conductive layer 201a and the second gate conductive layer 201b) and the first gate dielectric layer 203.

In the embodiments of the present disclosure, the second gate dielectric layer 202 includes N-type doped silicon carbide.

In the embodiments of the present disclosure, the first gate dielectric layer 203 may be a silicon oxide layer. Since both the second gate dielectric layer 202 and the first gate dielectric layer 203 contain 4-valent silicon, the second gate dielectric layer 202 and the first gate dielectric layer 203 will be more closely combined, thus making the defects between the second gate dielectric layer and the first gate dielectric layer smaller, further reducing the gate induced drain leakage current of the gate structure, and improving the electrical performance of the semiconductor structure.

In some embodiments, further referring to FIG. 1, the semiconductor structure 100 further includes a gate insulating layer 204 located on the surfaces of the second gate dielectric layer 202 and the first gate dielectric layer 203, wherein the top surface of the gate insulating layer 204 is flush with the top surface of the substrate 10.

In the embodiments of the present disclosure, the gate insulation layer 204 may be silicon nitride or silicon oxide.

In other embodiments, the semiconductor structure 100 may further include a bit line structure, a capacitor structure, or other functional structures.

In some embodiments, the gate structure in the semiconductor structure may be an embedded gate structure. In other embodiments, the gate structure in the semiconductor structure may also be a Flat Gate structure, an Omega Gate structure, a Gate-all-around (GAA) structure, or a Double Gate structure.

Figure 2A:
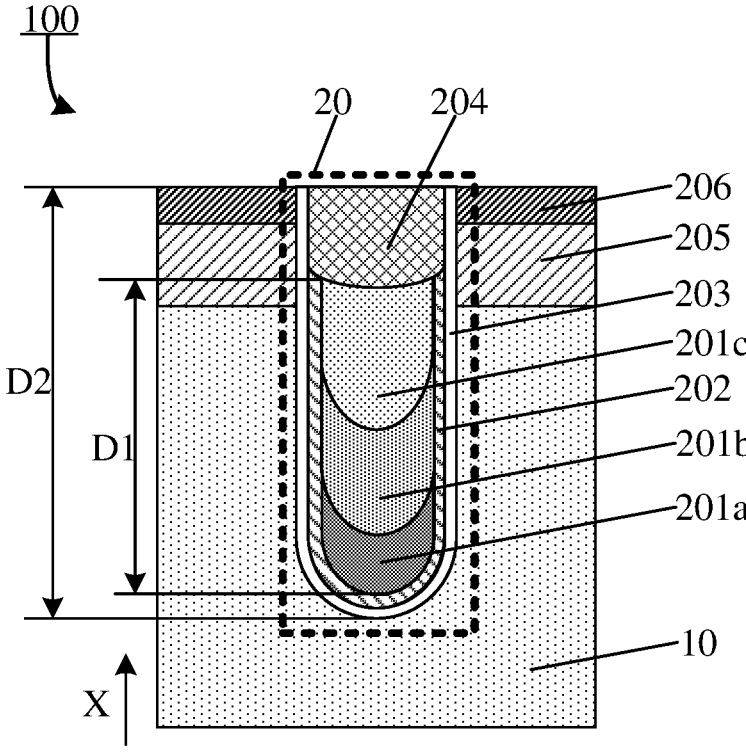
FIG. 2A is a structural diagram I of a semiconductor structure with an embedded gate structure according to an embodiment of the present disclosure.
Figure 2B:
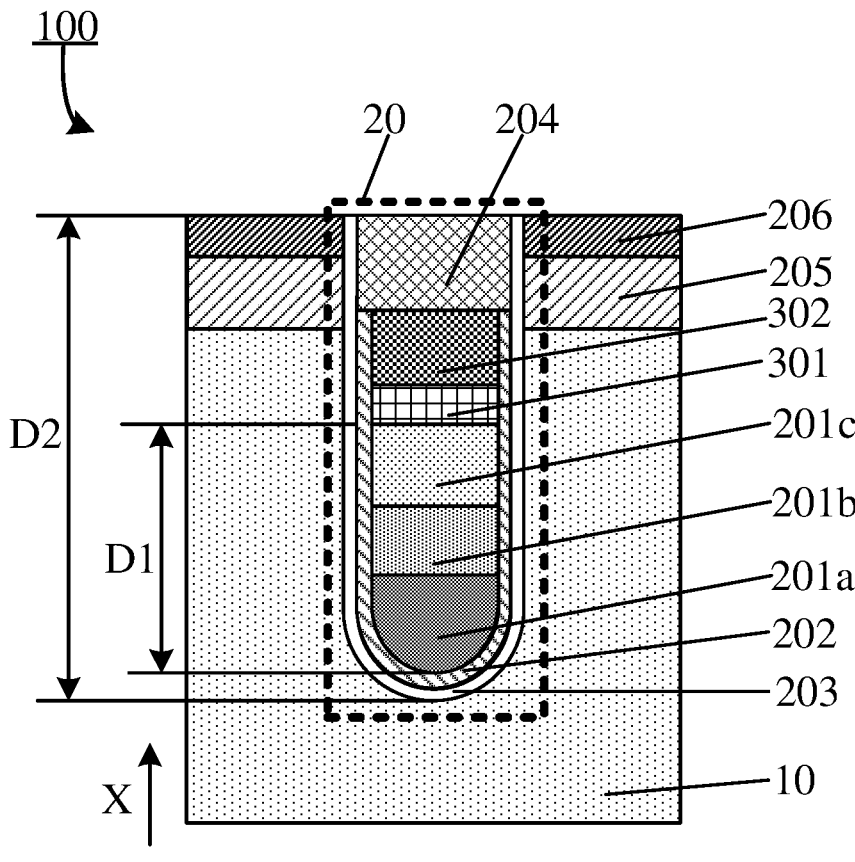
FIG. 2B is a structural diagram II of a semiconductor structure with an embedded gate structure according to an embodiment of the present disclosure.

FIGS. 2a and 2b are structural diagrams of a semiconductor structure with an embedded gate structure according to embodiments of the present disclosure. As shown in FIGS. 2a and 2b, the semiconductor structure 100 includes: a gate structure 20 located on a substrate 10; and the gate structure 20 includes for example, three gate conductive layers, i.e., a first gate conductive layer 201a, a second gate conductive layer 201b and a third gate conductive layer 201c; wherein the first gate conductive layer 201a, the second gate conductive layer 201b and the third gate conductive layer 201c have the same composition, and the first gate conductive layer 201a, the second gate conductive layer 201b and the third gate conductive layer 201c have different characteristic parameters. For example, the first gate conductive layer 201a, the second gate conductive layer 201b and the third gate conductive layer 201c have different thicknesses, or the first gate conductive layer 201a, the second gate conductive layer 201b and the third gate conductive layer 201c have different component contents, or the first gate conductive layer 201a, the second gate conductive layer 201b and the third gate conductive layer 201c have different shapes.

In the embodiments of the present disclosure, the components of the first gate conductive layer 201a, the second gate conductive layer 201b and the third gate conductive layer 201c are the same, for example, the first gate conductive layer 201a, the second gate conductive layer 201b and the third gate conductive layer 201c can all be titanium nitride, each of the first gate conductive layer 201a, the second gate conductive layer 201b and the third gate conductive layer 201c includes a nitrogen component and a metallic titanium component, and the nitrogen components in the first gate conductive layer 201a, the second gate conductive layer 201b and the third gate conductive layer 201c are different, the three-layer titanium nitride with appropriate character line resistance value used as the gate conductive layer will not cause capacitance-resistance delay.

In some embodiments, further referring to FIGS. 2a and 2b, the gate structure 20 may further include a second gate dielectric layer 202 and a first gate dielectric layer 203. The first gate conductive layer 201a, the second gate conductive layer 201b and the third gate conductive layer 201c are located on the surface of the second gate dielectric layer 202, and the second gate dielectric layer 202 is located on the surface of the first gate dielectric layer 203.

In some embodiments, further referring to FIGS. 2a and 2b, the substrate 10 includes a plurality of gate grooves inside (only one gate groove is shown in FIGS. 2a and 2b).

The first gate dielectric layer 203 is located on an inner wall of the gate groove, and the first gate conductive layer 201a, the second gate conductive layer 201b, and the third gate conductive layer 201c are located at the bottom of the gate groove with the first gate dielectric layer 203. In the direction perpendicular to the surface of the substrate, the total size D1 of the first gate conductive layer 201a, the second gate conductive layer 201b and the third gate conductive layer 201c is smaller than the size D2 of the gate groove.

In some embodiments, the work function of the gate conductive layer decreases gradually along the direction from the bottom of the gate groove to the top of the gate groove. For example, when the gate structure includes two gate conductive layers, the work function of the first gate conductive layer located at the bottom layer is the large, and the work function of the second gate conductive layer located at the top layer is the small. For example, in other embodiments, when the gate structure includes three gate conductive layers, the work functions of the first gate conductive layer 201a located at the bottom layer, the second gate conductive layer 201b located at the middle layer, and the third gate conductive layer 201c located at the top layer gradually decrease. In the embodiments of the present disclosure, the work function of each gate conductive layer can be adjusted accordingly by adjusting the nitrogen component concentration of the gate conductive layer, so that in the gate structure, the work function of the gate conductive layer decreases gradually along the direction from the bottom of the gate groove to the top of the gate groove, so that the work function of the gate conductive layer (such as TiN gate electrode) at the bottom layer is the highest, and the work function of the gate conductive layer (such as TiN gate electrode) at the top layer is the lowest. Such combination can not only solve the problem of Row hammer, but also improve the problem of gate induced drain leakage current (GIDL). At the same time, such combination makes the resistance of the gate structure lower.

When the semiconductor structure in the embodiments of the present disclosure is a dynamic random access memory, since the DRAM programming and erasing processes need to be operated through word lines (i.e. gate structure), when a word line of a DRAM memory unit is repeatedly operated, it may cause the charges in the adjacent memory unit be attracted and the data be lost, which will lead to serious line hammering problems. In the embodiments of the present disclosure, by setting multi-layer gate conductive layers with different thicknesses, different component contents or different shapes, the work function of the gate conductive layer and the threshold voltage of the gate structure are adjusted, so that the work functions of at least two gate conductive layers are reduced sequentially (that is, the threshold voltages are reduced sequentially) along the bottom of the gate groove to the top of the gate groove, so that the Row hammer phenomenon in DRAM can be effectively suppressed. In addition, GIDL can also be improved. Compared with the Hybrid Buried Word Line (HBW) in the related art, the modulated metal gate word line has a lower resistance and a better resistance capacitance delay.

In some embodiments, the first gate dielectric layer located at the bottom of the gate groove has a first thickness, and the first gate dielectric layer located at the side wall of the gate groove has a second thickness. The second thickness is greater than the first thickness.

In the embodiments of the present disclosure, a first gate dielectric layer with a low step coverage is formed in the gate groove, so that the thickness of the first gate dielectric layer at the bottom of the gate groove is smaller than the thickness of the first gate dielectric layer at the side wall of the gate groove. On one hand, the gate induced drain leakage current can be reduced, and the control ability of the gate can be improved; on the other hand, the first gate dielectric layer at the bottom of the groove is relatively thin, and enough space can be reserved for the gate conductive layer to improve the conductivity of the gate channel.

It should be noted that in other embodiments, a relatively uniform first gate dielectric layer may also be formed in the gate groove, that is, the first gate dielectric layer located at the bottom of the gate groove has the same thickness as the first gate dielectric layer located at the side wall of the gate groove.

In some embodiments, further referring to FIGS. 2a and 2b, the second gate dielectric layer 202 is located in the gate groove, and the second gate dielectric layer 202 is located between the first gate conductive layer 201a and the first gate dielectric layer 203, between the second gate conductive layer 201b and the first gate dielectric layer 203, and between the third gate conductive layer 201c and the first gate dielectric layer 203.

In some embodiments, the second gate dielectric layer located at the bottom of the gate groove has a third thickness, and the second gate dielectric layer located at the side wall of the gate groove has a fourth thickness. The fourth thickness is greater than the third thickness.

In the embodiments of the present disclosure, a second gate dielectric layer with low step coverage is formed in the gate groove, so that the thickness of the second gate dielectric layer at the bottom of the gate groove is smaller than the thickness of the second gate dielectric layer at the side wall of the gate groove. On one hand, the gate induced drain leakage current can be reduced and the control ability of the gate can be improved; on the other hand, the second gate dielectric layer at the bottom of the groove is relatively thin, and enough space can be reserved for the gate conductive layer to improve the conductivity of the gate channel.

It should be noted that in other embodiments, a relatively uniform second gate dielectric layer can be formed in the gate groove, that is, the second gate dielectric layer located at the bottom of the gate groove has the same thickness as the second gate dielectric layer located at the side wall of the gate groove.

In some embodiments, further referring to FIGS. 2a and 2b, the semiconductor structure 100 further includes a gate insulating layer 204. The gate insulating layer 204 is located on the surface of the first gate dielectric layer 203 and the gate conductive layer (i.e. the third gate conductive layer 201c), and the top surface of the gate insulating layer 204 is flush with the top surface of the substrate 10.

In some embodiments, further referring to FIGS. 2a and 2b. the substrate 10 further includes a first doped region 205 and a second doped region 206 which is located on the surface of the first doped region 205. The doping concentration of the second doped region 206 is greater than the doping concentration of the first doped region 205, the gate groove runs through the second doped region 206 and the first doped region 205, and the bottom of the gate groove is located in the substrate 10.

In the embodiments of the present disclosure, the first doped region 205 and the second doped region 206 jointly constitute the source and drain of the semiconductor structure.

In the embodiments of the present disclosure, the work function of the second gate dielectric layer 202 is less than the work function of the second doped region 206. The second gate dielectric layer 202 may be, for example, N-type doped silicon carbide, and the work function (Φ) of the N-type doped silicon carbide (N+SiC) is 3.1 electron volts (eV). The second doped region 206 may be N-type doped silicon substrate, and the work function (Φ) of N-type doped silicon substrate (N+Si) is 4.17 eV. The work function of the second gate dielectric layer is smaller than the work function of the second doped region, which can reduce the interzonal leakage that causes the gate induced drain leakage current and improve the electrical performance of the semiconductor structure.

In the embodiments of the present disclosure, the first doped region and the second doped region are provided with different concentrations. The first doped region is an N-type light doped region, which can effectively reduce the electric field between the gate and the source or between the gate and the drain, improve GIDL, and reduce the leakage current.

In some embodiments, the substrate 10 may further include only the second doped region 206 which constitutes the source and the drain of the semiconductor structure.

In some embodiments, further referring to FIG. 2B, the gate structure 20 also includes: a first semiconductor layer 301 and a first conductor layer 302.

The first semiconductor layer 301 is located on the outermost layer of the gate conductive layers, such as located on the third gate conductive layer 201c. The first semiconductor layer 301 is used to connect the third gate conductive layer 201c and the first conductor layer 302. The first semiconductor layer 301 may be a metal silicide layer. Since the metal silicide has a relatively low resistance, the contact resistance between the third gate conductive layer 201c and the first conductor layer 302 can be reduced, and therefore the power consumption of the semiconductor structure can further be reduced. Here, the first conductor layer 302 may be a polysilicon layer or any metal layer, for example, any one or any combination of cobalt, titanium, tantalum, nickel (Ni), tungsten, platinum (Pt) and palladium (Pd).

In some embodiments, further referring to FIG. 2B, the gate insulation layer 204 is further located on the surfaces of the first gate dielectric layer 203 and the first conductor layer 302, and the top surface of the gate insulation layer 204 is flush with the top surface of the substrate 10.

In some embodiments, each of the gate conductive layers has a preset shape on the first surface and the second surface along the direction of the thickness of the substrate. The preset shape includes a planar shape, and/or an arc shape, such as Ω shape or concave shape.

As shown in FIG. 2A, the first gate conductive layer 201a, the second gate conductive layer 201b and the third gate conductive layer 201c are of an arc shape on both surfaces along the direction of the thickness of the substrate 10 (X-axis direction). As shown in FIG. 2B, the first gate conductive layer 201a is of an arc shape and a planar shape on the first surface and the second surface along the direction of X axis, respectively, while the second gate conductive layer 201b and the third gate conductive layer 201c are of planar shapes on both surfaces along the direction of X axis.

In the embodiments of the present disclosure, each gate conductive layer has an arc shape or a planar shape. When the gate conductive layer has an arc surface, more gate dielectric layer materials may be placed on both sides of the gate conductive layer, thus increasing the distances between the gate conductive layer and the source and the drain, and improving the problems of leakage currents such as GIDL.

In some embodiments, further referring to FIGS. 2a and 2b, the two surfaces of the gate insulation layer 204 along the direction of the thickness of the substrate may be of an arc shape and a planar shape respectively (as shown in FIG. 2A) or both planar shapes (as shown in FIG. 2B).

In the embodiments of the present disclosure, since the components of the first gate conductive layer 201*a*, the second gate conductive layer 201*b* and the third gate conductive layer 201*c* are the same, but the characteristic parameters (such as at least one of thickness, component content and shape) of the first gate conductive layer 201*a*, the second gate conductive layer 201*b* and the third gate conductive layer 201*c* are different, the work functions of the first gate conductive layer 201*a*, the second gate conductive layer 201*b* and the third gate conductive layer 201*c* are caused to be adjustable, thereby making the threshold voltage of the gate structure in the embodiments of the present disclosure adjustable. In this way, the gate induced drain leakage current of the semiconductor structure can be effectively reduced, and the retention performance of the semiconductor structure can be improved.

Figure 3:
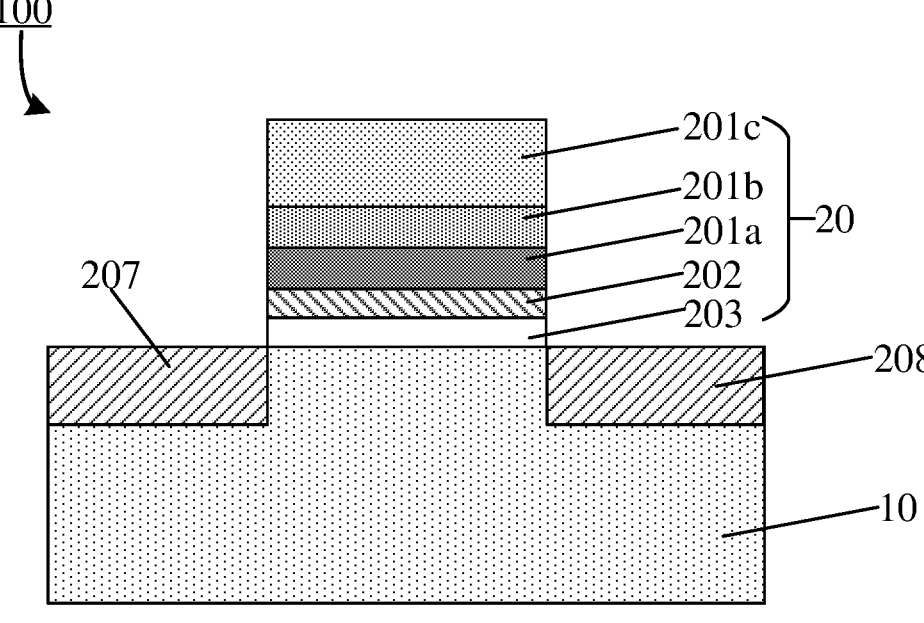
FIG. 3 is a structural diagram of a semiconductor structure with a planar gate structure according to an embodiment of the present disclosure.

FIG. 3 is a structural diagram of a semiconductor structure with a planar gate structure according to an embodiment of the present disclosure. As shown in FIG. 3, the semiconductor structure 100 includes: a gate structure 20 located on a substrate 10. The gate structure 20 includes three gate conductive layers, which are a first gate conductive layer 201*a*, a second gate conductive layer 201*b* and a third gate conductive layer 201*c* respectively. The first gate conductive layer 201*a*, the second gate conductive layer 201*b* and the third gate conductive layer 201*c* have the same composition, and the first gate conductive layer 201*a*, the second gate conductive layer 201*b* and the third gate conductive layer 201*c* have different characteristic parameters. For example, the first gate conductive layer 201*a*, the second gate conductive layer 201*b* and the third gate conductive layer 201*c* have different thicknesses, or the first gate conductive layer 201*a*, the second gate conductive layer 201*b* and the third gate conductive layer 201*c* have different component contents, or the first gate conductive layer 201*a*, the second gate conductive layer 201*b* and the third gate conductive layer 201*c* have different shapes.

In some embodiments, further referring to FIG. 3, the gate structure 20 may further include a second gate dielectric layer 202 and a first gate dielectric layer 203. The first gate conductive layer 201*a*, the second gate conductive layer 201*b* and the third gate conductive layer 201*c* are all located on the surface of the second gate dielectric layer 202, and the second gate dielectric layer 202 is located on the surface of the first gate dielectric layer 203.

In the embodiments of the present disclosure, the work function of the second gate dielectric layer 202 is less than the work function of the substrate 10, so that the gate induced drain leakage current of the gate structure can be further reduced and the electrical performance of the semiconductor structure can be improved.

In some embodiments, further referring to FIG. 3, the substrate 10 includes a plurality of well regions (only two well regions are shown in FIG. 3), and the adjacent two well regions may be used as the source 207 or the drain 208 of the transistor.

In some embodiments, further referring to FIG. 3, the second gate dielectric layer 202 is located on the upper surface of the substrate 10 and located between the source 207 and the drain 208. The first gate dielectric layer 203 is located between the second gate dielectric layer 202 and the substrate 10.

Figure 4A:
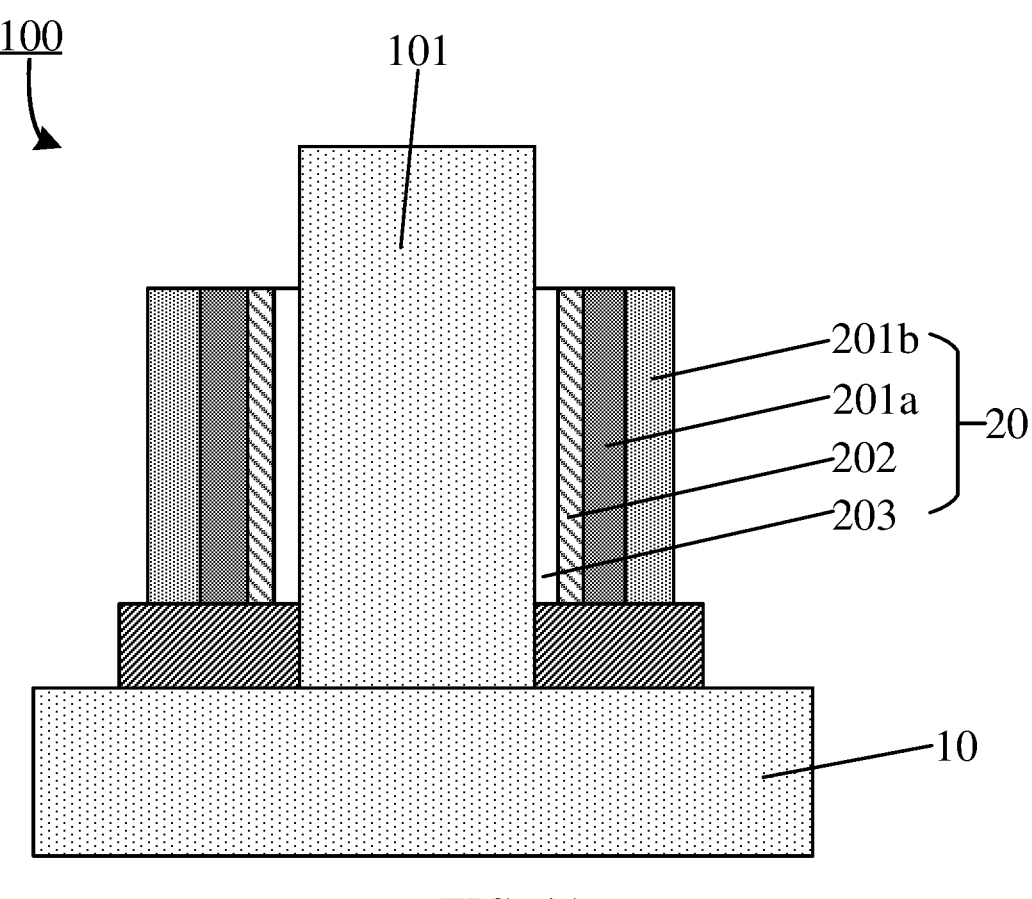
FIG. 4A is a structural diagram I of a gate-all-around semiconductor structure according to an embodiment of the present disclosure.
Figure 4B:
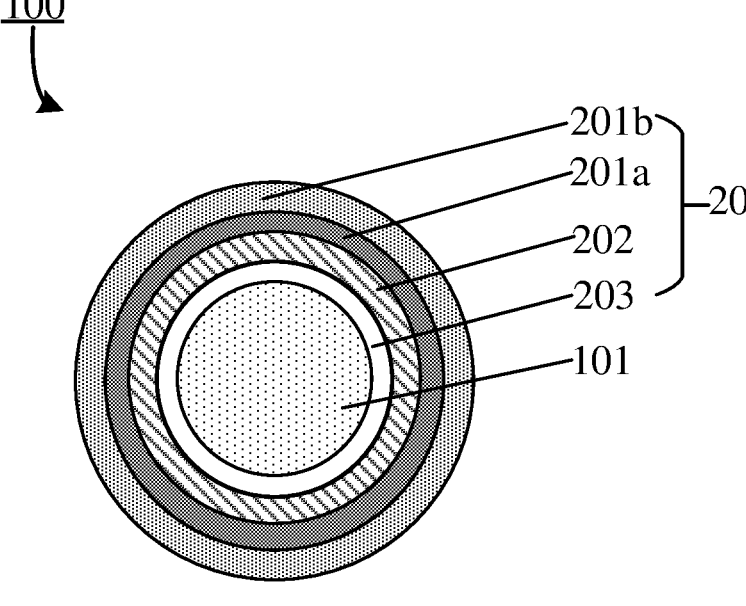
FIG. 4B is a structural diagram II of a gate-all-around semiconductor structure according to an embodiment of the present disclosure.

FIGS. 4*a* and 4*b* are the structural diagrams of a gate-all-around semiconductor structure according to the embodiments of the present disclosure, where FIG. 4A is a sectional view, and FIG. 4B is a top view of the gate-all-around structure. As shown in FIGS. 4*a* and 4*b*, the semiconductor structure 100 includes: a gate structure 20 located on a substrate 10. The gate structure 20 includes two gate conductive layers, which are a first gate conductive layer 201*a* and a second gate conductive layer 201*b* respectively. The first gate conductive layer 201*a* and the second gate conductive layer 201*b* have the same components, and the first gate conductive layer 201*a* and the second gate conductive layer 201*b* have different characteristic parameters, and the characteristic parameters includes thickness, component content or shape.

In some embodiments, further referring to FIGS. 4*a* and 4*b*, the gate structure 20 may further include a second gate dielectric layer 202 and a first gate dielectric layer 203. The first gate conductive layer 201*a* and the second gate conductive layer 201*b* are located on the surface of the second gate dielectric layer 202, and the second gate dielectric layer 202 is located on the surface of the first gate dielectric layer 203.

In the embodiments of the present disclosure, the work function of the second gate dielectric layer 202 is less than the work function of the substrate 10, so that the gate induced drain leakage current of the gate structure can be further reduced and the electrical performance of the semiconductor structure can be improved.

In some embodiments, further referring to FIGS. 4*a* and 4*b*, the substrate 10 includes a plurality of mutually isolated active columns 101 (only one active column is shown in FIGS. 4*a* and 4*b*). The first gate dielectric layer 203, the second gate dielectric layer 202, the first gate conductive layer 201*a* and the second gate conductive layer 201*b* sequentially cover some of the active columns 101 in a circular manner, and the remaining active columns 101 are used as the sources or the drains of the transistors.

In the embodiments of the present disclosure, since the components of the first gate conductive layer 201*a* and the second gate conductive layer 201*b* are the same, but the characteristic parameters of the first gate conductive layer 201*a* and the second gate conductive layer 201*b* (such as at least one of thickness, component content, and surface shape) are different, the work functions of the first gate conductive layer 201*a* and the second gate conductive layer 201*b* are caused to be adjustable, so that the threshold voltage of the gate structure in the embodiments of the present disclosure is adjustable. Therefore, the problem of improving leakage currents, such as GIDL, of the semiconductor structure can be effectively reduced, and the retention performance of the semiconductor structure can be improved.

Figure 5:
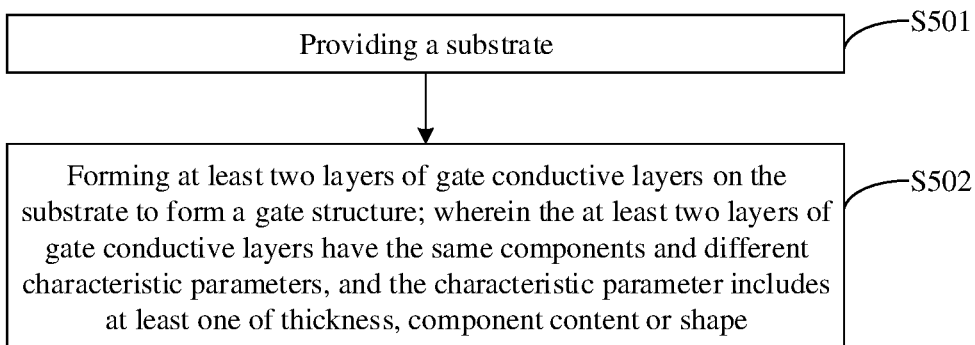
FIG. 5 is a flow diagram of a method for forming a semiconductor structure according to an embodiment of the present disclosure.

In addition, the embodiments of the present disclosure further provide a method for forming a semiconductor structure. FIG. 5 is a flowchart of a method for forming a semiconductor structure according to an embodiment of the present disclosure. As shown in FIG. 5, the method for forming the semiconductor structure includes the following steps:

In step S501, a substrate is provided.

In some embodiments, the substrate may be an N-type doped silicon substrate or a P-type doped silicon substrate.

In step S502, at least two gate conductive layers are formed on the substrate to form a gate structure. The at least two gate conductive layers have the same components and different characteristic parameters. The characteristic parameter includes at least one of thickness, component content or shape.

In some embodiments, the gate structure further includes a first gate dielectric layer and a second gate dielectric layer. Before forming the at least two gate conductive layers, the method for forming the semiconductor structure further includes: sequentially forming a first gate dielectric layer and a second gate dielectric layer which is located between the gate conductive layer and the first gate dielectric layer.

Taking the gate structure of the semiconductor structure being an embedded gate structure as an example, the detailed process for forming the gate structure is illustrated below. FIGS. 6a-6g are the structural diagrams in the process of forming a semiconductor structure according to the embodiments of the present disclosure. The process of forming the semiconductor structure according to the embodiments of the present disclosure is illustrated in detail below in combination with FIGS. 6a-6g.

Firstly, a substrate is doped to form a first doped region and a second doped region which is located on the surface of the first doped region. The doping concentration of the second doped region is greater than the doping concentration of the first doped region.

In the embodiments of the present disclosure, the first doped region and the second doped region jointly constitute the source and the drain of the semiconductor structure.

In the embodiments of the present disclosure, the work function of the second gate dielectric layer is less than the work function of the second doped region, so that the interzonal leakage that causes the gate induced leakage current may be reduced, and the electrical performance of the semiconductor structure can be improved.

In the embodiments of the present disclosure, the first doped region and the second doped region with different concentrations are set. The first doped region is an N-type light doped region, which can effectively reduce the electric field between the gate and the source or between the gate and the drain, improve GIDL, and reduce the leakage current.

Figure 6A:
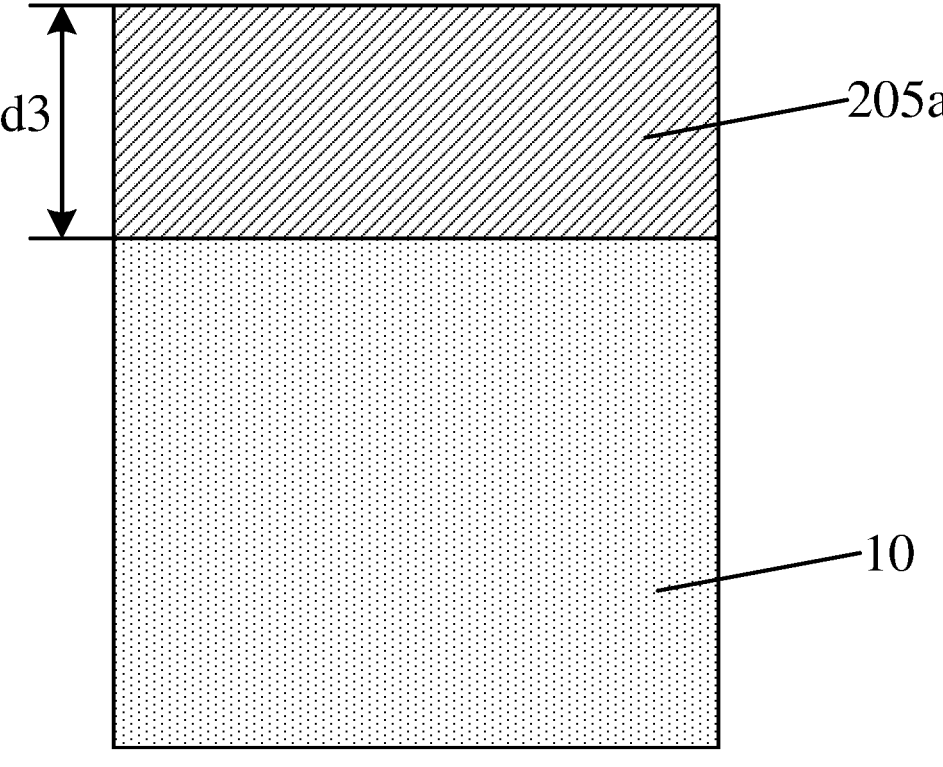
FIG. 6A is a structural diagram I of a semiconductor structure formation process according to an embodiment of the present disclosure.
Figure 6B:
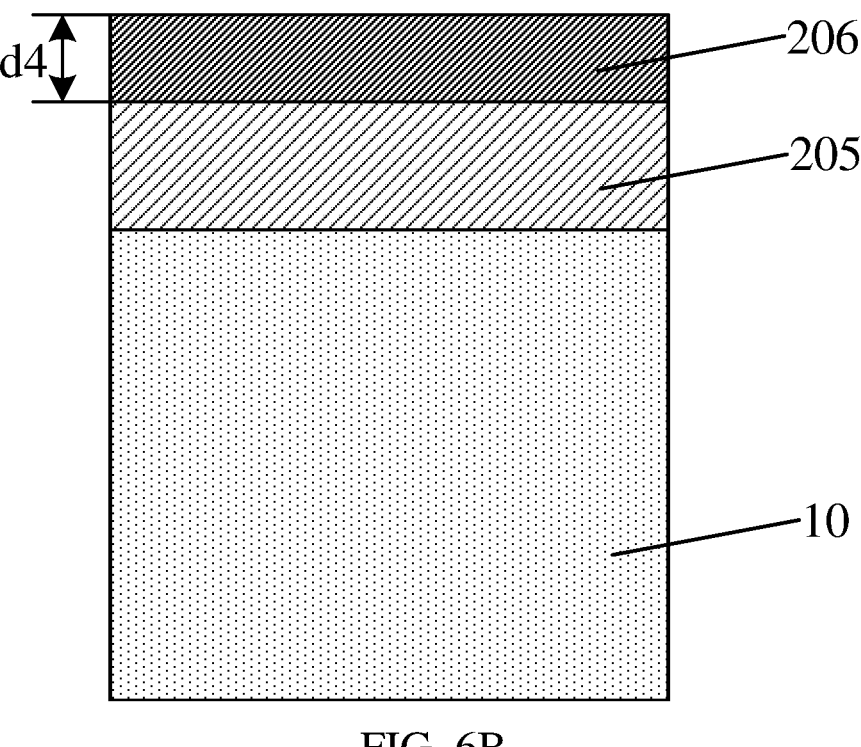
FIG. 6B is a structural diagram II of a semiconductor structure formation process according to an embodiment of the present disclosure.
Figure 6C:
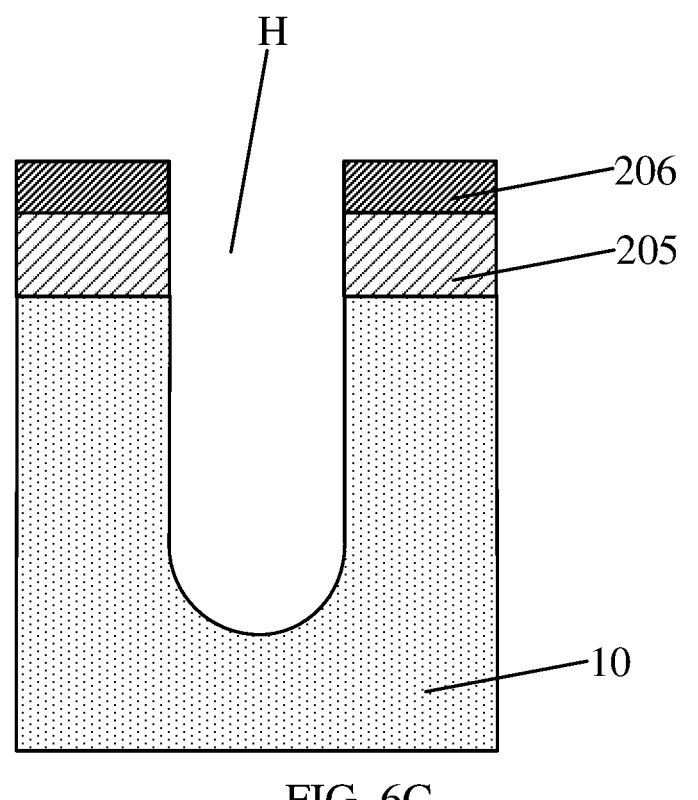
FIG. 6C is a structural diagram III of a semiconductor structure formation process according to an embodiment of the present disclosure.
Figure 6D:
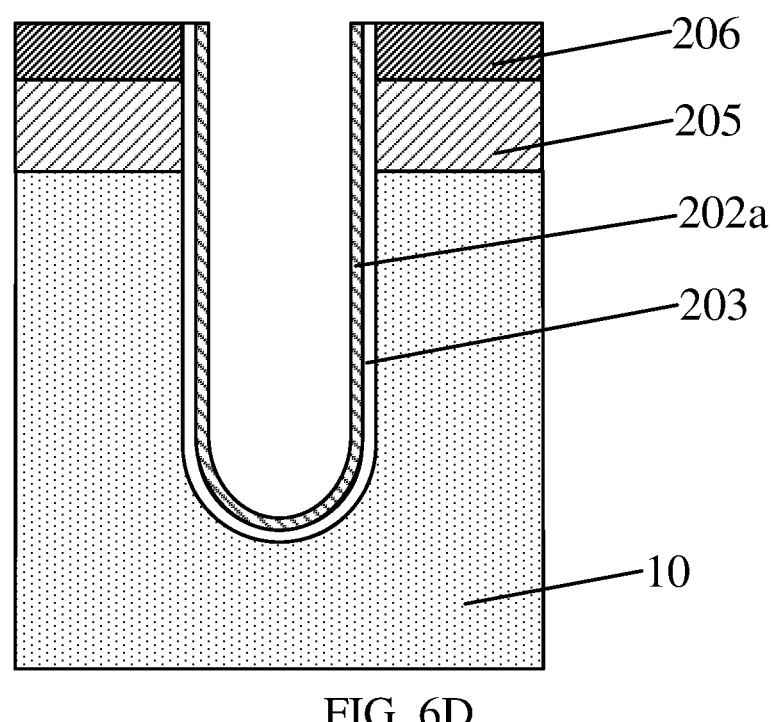
FIG. 6D is a structure diagram IV of a semiconductor structure formation process according to an embodiment of the present disclosure.
Figure 6E:
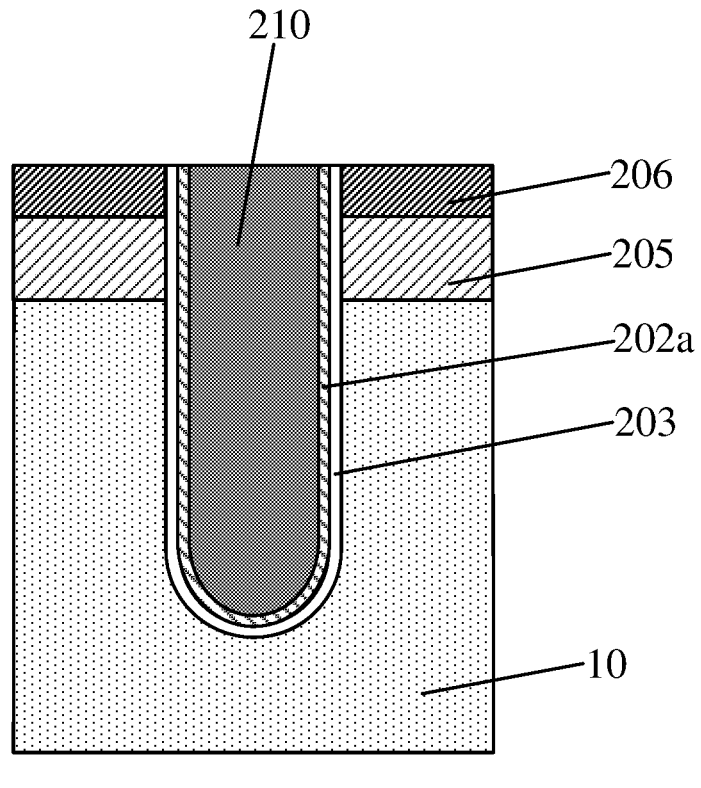
FIG. 6E is a structure diagram V of a semiconductor structure formation process according to an embodiment of the present disclosure.
Figure 6F:
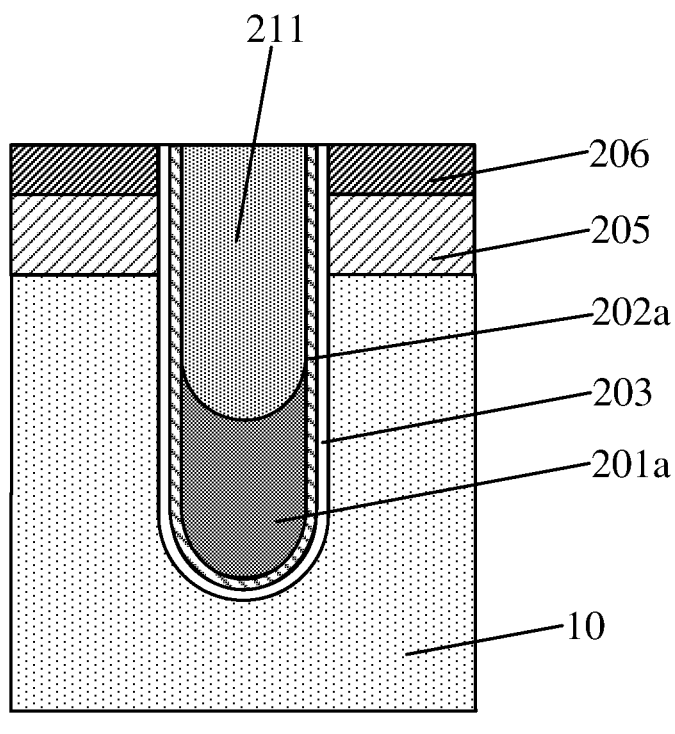
FIG. 6F is a structural diagram VI of a semiconductor structure formation process according to an embodiment of the present disclosure.

As shown in FIG. 6A, arsenic ions or phosphorus ions are adopted to dope the substrate 10 with a first size d3 along the surface of the substrate 10, to form a first initial doping region 205a; next, as shown in FIG. 6B, the arsenic ions or phosphorus ions are continuously adopted to dope the first initial doping region 205a with a second size d4 for the second time along the surface of the first initial doping region 205a to form a second doping region 206, and the remaining first initial doping region 205a without the second doping constitutes a first doping region 205, where the first size d3 is larger than the second size d4.

Next, referring to FIGS. 6c-6g, the process of forming the gate structure is illustrated.

In the embodiments of the present disclosure, the gate structure includes a first gate conductive layer and a second gate conductive layer. The gate structure may be formed by the following steps: sequentially etching the second doped region, the first doped region and the substrate to form a gate groove; sequentially forming a first gate dielectric layer and a second initial gate dielectric layer on the inner wall of the gate groove; forming a first initial gate conductive layer in the gate groove with the first gate dielectric layer and the second initial gate dielectric layer; back etching the first initial gate conductive layer to expose part of the second initial gate dielectric layer and form the first gate conductive layer; forming a second initial gate conductive layer in the gate groove with the first gate conductive layer; back etching the second initial gate conductive layer and the second initial gate dielectric layer to expose part of the first gate dielectric layer and form the second gate conductive layer and a second gate dielectric layer.

As shown in FIGS. 6c-6g, the second doped region 206, the first doped region 205 and the substrate 10 are etched sequentially with the surface of the second doped region 206 as the etching starting point to form a gate groove H. A first dielectric material is deposited on the inner wall of the gate groove H to form a first gate dielectric layer 203, a second dielectric material is deposited on the surface of the first gate dielectric layer 203, and the first dielectric material is doped by adopting arsenic ions or phosphorus ions to form a second initial gate dielectric layer 202a. A first gate conductive material is deposited in the gate groove with the first gate dielectric layer 203 and the second initial gate dielectric layer 202a to form a first initial gate conductive layer 210. The first initial gate conductive layer 210 is back etched to expose part of the second initial gate dielectric layer 202a and form a first gate conductive layer 201a. A second gate conductive material is deposited in the gate groove with the first gate conductive layer 201a to form a second initial gate conductive layer 211. The second initial gate conductive layer 211 and the second initial gate dielectric layer 202a are back etched to expose part of the first gate dielectric layer 203 and form the second gate conductive layer 201b and the second gate dielectric layer 202.

In the embodiments of the present disclosure, the first dielectric material may be silicon oxide or silicon oxynitride; the second medium material may be silicon carbide; and the first gate conductive material and the second gate conductive material may be titanium nitride, or composite materials of titanium nitride and metal titanium.

In some embodiments, the work function of the second gate conductive layer 201b may be smaller than the work function of the first gate conductive layer 201a. In this way, not only the problem of Row hammer can be solved, but also GIDL can be improved.

In the embodiments of the present disclosure, since both the second gate dielectric layer and the first gate dielectric layer contain 4-valent silicon, the second gate dielectric layer and the first gate dielectric layer will be more closely combined, thus making the defects between the second gate dielectric layer and the first gate dielectric layer smaller, further reducing the gate induced drain leakage current of the gate structure, and improving the electrical performance of the semiconductor structure.

In the embodiments of the present disclosure, the first gate dielectric layer, the second initial gate dielectric layer, the first initial gate conductive layer and the second initial gate conductive layer can be formed by any suitable deposition process, for example, Chemical Vapor Deposition (CVD) process, Physical Vapor Deposition (PVD) process, Atomic Layer Deposition (ALD) process, spin coating process or coating process.

Both the surfaces of the first gate conductive layer 201a and the second gate conductive layer 201b formed in the embodiments of the present disclosure are of an arc shape, and both sides of the gate conductive layer with an arc-shaped surface may have more gate dielectric layer materials, thereby increasing the distances between the gate conductive layer and the source and the drain, and improving the leakage current problems such as GIDL.

In other embodiments, the formed first gate conductive layer 201a and second gate conductive layer 201b may also have a planar shape.

Figure 6G:
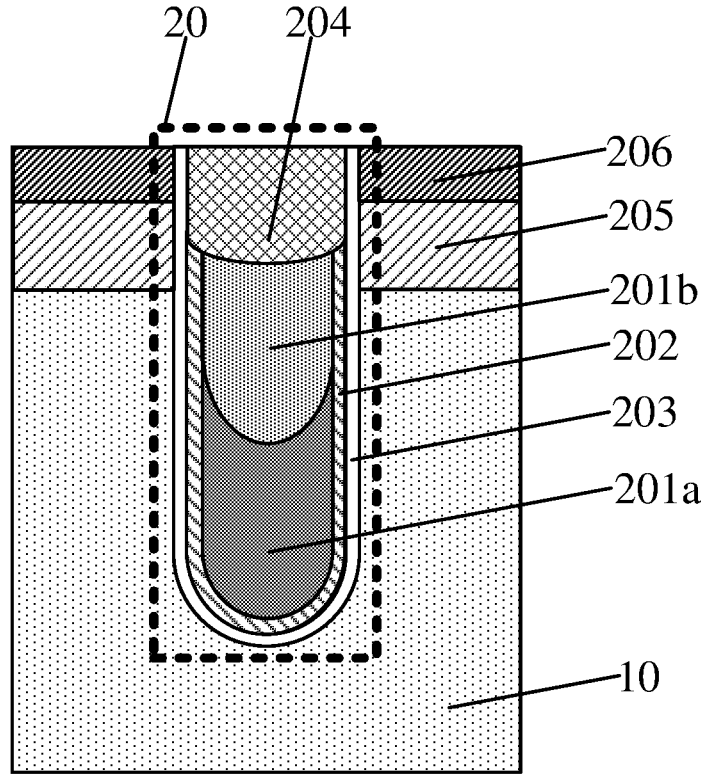
FIG. 6G is a schematic diagram VII of a semiconductor structure formation process according to an embodiment of the present disclosure.

In some embodiments, further referring to FIG. 6G, after the second gate conductive layer 201b is formed, the method for forming the semiconductor structure further includes: depositing insulating materials on the surfaces of the second gate dielectric layer 202 and the second gate conductive layer 201*b* to form a gate insulating layer 204; and the top surface of the gate insulating layer 204 is flush with the top surface of the second doped region 206. The first gate dielectric layer 203, the second gate dielectric layer 202, the first gate conductive layer 201*a*, the second gate conductive layer 201*b*, and the gate insulating layer 204 jointly constitute the gate structure 20.

In the embodiments of the present disclosure, the insulating material may be silicon oxide, silicon nitride or silicon oxynitride, and the insulating material can be deposited by any suitable deposition process to form the gate insulating layer.

In other embodiments, the gate structure may also be a planar gate structure. The substrate includes a plurality of well regions. The two adjacent well regions constitute the source and the drain of the semiconductor structure respectively. The gate structure may be formed on the surface of the substrate between two adjacent well regions.

In some embodiments, the gate structure may include a first gate conductive layer and a second gate conductive layer, and the gate structure may be formed by the following steps:

In step 1, a first initial gate dielectric layer, a second initial gate dielectric layer, a first initial gate conductive layer and a second initial gate conductive layer are formed sequentially on the surface of the substrate from bottom to top.

In step 2, the second initial gate conductive layer, the first initial gate conductive layer, the second initial gate dielectric layer and the first initial gate dielectric layer are etched sequentially through a mask layer with a preset window, to expose the well regions and form the second gate conductive layer, the first gate conductive layer, the second gate dielectric layer and the first gate dielectric layer.

In other embodiments, the gate structure may also be gate-all-around. The substrate includes a plurality of active columns, and the gate structure may be formed around each active column. The gate structure may include the first gate conductive layer and the second gate conductive layer. The gate structure may further be formed by the following steps:

In step 1, a first initial gate dielectric layer, a second initial gate dielectric layer, a first initial gate conductive layer and a second initial gate conductive layer are formed sequentially on the side wall of the active columns.

In step 2, the first initial gate dielectric layer, the second initial gate dielectric layer, the first initial gate conductive layer and the second initial gate conductive layer are back etched to expose part of the active columns and form the first gate dielectric layer, the second gate dielectric layer, the first gate conductive layer and the second gate conductive layer.

The process of forming the semiconductor structure according to the embodiments of the present disclosure is similar to the semiconductor structure in the above embodiments. For the technical features not disclosed in detail in the embodiments of the present disclosure, further referring to the above embodiments for understanding, which will not be repeated here.

The method for forming the semiconductor structure according to the embodiments of the present disclosure can prepare a gate structure with an adjustable threshold voltage composed of a plurality of gate conductive layers with adjustable work functions through a simple process flow, which can effectively reduce the gate induced drain leakage current of the prepared semiconductor structure and improve the retention performance of the semiconductor structure.

In several embodiments according to the present disclosure, it should be understood that the disclosed structure and method may be realized in a non target way. The structural embodiments described above are only schematic. For example, the division of units is only a logical function division, and there may be other division methods in actual implementation, such as: a plurality of units or components can be combined, or integrated into another system, or some features can be ignored or not implemented.

The features disclosed in several methods or structural embodiments provided by the present disclosure may be combined without conflict to obtain new method embodiments or structural embodiments.

The above are only some implementations of the present disclosure, but the scope of protection of the present disclosure is not limited to this. Any changes or replacements can be easily thought of by those skilled in the art within the scope of the present disclosure should be covered in the scope of protection of the present disclosure. Therefore, the protection scope of the present disclosure shall be subject to the protection scope of the claims.

The embodiments of the present disclosure provide a semiconductor structure and a forming method therefor, the semiconductor structure includes a gate structure located on a substrate. Since the gate structure includes at least two gate conductive layers, and the at least two gate conductive layers have the same components and different characteristic parameters, and the characteristic parameters includes thickness, component content or shape. Therefore, different thicknesses, different component contents or different shapes make the work function and threshold voltage of each gate conductive layer in the gate structure adjustable, which can effectively reduce the gate induced drain leakage current of the semiconductor structure and improve the performance of the semiconductor structure.

What is claimed is:

1. A semiconductor structure, comprising:
a gate structure located on a substrate, the gate structure comprising at least two gate conductive layers;
a first gate dielectric layer and a second gate dielectric layer; and
a first semiconductor layer and a first conductor layer, which are located on a surface of the at least two gate conductive layers;
wherein the substrate comprises a source and a drain, wherein at least one of the source or the drain comprises: a first doped region and a second doped region which is located on a surface of the first doped region, wherein a work function of the second gate dielectric layer is less than a work function of the second doped region; and
the at least two gate conductive layers have same components and different characteristic parameters; and the characteristic parameters comprise at least one of thickness, component content or shape, wherein components in each of the at least two gate conductive layers comprise a nitrogen component and a metal component, and wherein a concentration of the nitrogen component is different in different gate conductive layers.

2. The semiconductor structure according to claim 1, wherein each of the at least two gate conductive layers has a preset shape on a first surface and a second surface along a direction of a thickness of the substrate; and the preset shape comprises a planar shape and an arc shape.

3. The semiconductor structure according to claim 1, wherein the second gate dielectric layer is located between the at least two gate conductive layers and the first gate dielectric layer, and the second gate dielectric layer comprises N-type doped silicon carbide.

4. The semiconductor structure according to claim 3, wherein the substrate comprises a plurality of gate grooves;
    wherein the first gate dielectric layer is located on an inner wall of the gate groove, and the at least two gate conductive layers are located at bottom of the gate grooves with the second gate dielectric layer; and
    wherein in a direction perpendicular to a surface of the substrate, a size of the at least two gate conductive layers is smaller than a size of the gate groove.

5. The semiconductor structure according to claim 4, wherein a work function of the at least two gate conductive layers decreases gradually along the bottom of the gate grooves to top of the gate grooves.

6. The semiconductor structure according to claim 5, wherein the first gate dielectric layer located at the bottom of the gate grooves has a first thickness, the first gate dielectric layer located at a side wall of the gate grooves has a second thickness, and the second thickness is greater than the first thickness.

7. The semiconductor structure according to claim 6, wherein the second gate dielectric layer located at the bottom of the gate grooves has a third thickness, the second gate dielectric layer located at the side wall of the gate grooves has a fourth thickness, and the fourth thickness is greater than the third thickness.

8. The semiconductor structure according to claim 7, wherein the semiconductor structure further comprises a gate insulating layer; and
    wherein the gate insulating layer is located on surfaces of the first gate dielectric layer and the at least two gate conductive layers, and a top surface of the gate insulating layer is flush with a top surface of the substrate.

9. The semiconductor structure according to claim 8, wherein a doping concentration of the second doped region is greater than a doping concentration of the first doped region.

10. The semiconductor structure according to claim 1, wherein the second gate dielectric layer is located on an upper surface of the substrate and located between the source and the drain; and
    wherein the first gate dielectric layer is located between the second gate dielectric layer and the substrate.

11. The semiconductor structure according to claim 3, wherein the substrate comprises a plurality of mutually isolated active columns; and
    the first gate dielectric layer, the second gate dielectric layer and the at least two gate conductive layers sequentially cover part of the active columns in a circular manner, and remaining ones of the active columns are used as sources or drains of transistors.

12. A method for forming the semiconductor structure of claim 1, comprising:
    providing the substrate; and
    forming the at least two gate conductive layers on the substrate to form the gate structure.

13. The method according to claim 12, wherein before forming the at least two gate conductive layers, the method further comprises:
    sequentially forming the first gate dielectric layer and the second gate dielectric layer which is located between the at least two gate conductive layers and the first gate dielectric layer.

14. The method according to claim 13, wherein before forming the gate structure, the method further comprises:
    doping the substrate to form a first doped region and a second doped region which is located on a surface of the first doped region, wherein a doping concentration of the second doped region is greater than a doping concentration of the first doped region, and
    wherein a work function of the second gate dielectric layer is smaller than a work function of the second doped region.

15. The method according to claim 14, wherein the gate structure is formed in a gate groove of the substrate; and the gate structure comprises at least a first gate conductive layer and a second gate conductive layer, and the gate structure is formed by the following steps:
    sequentially etching the second doped region, the first doped region and the substrate to form the gate groove;
    sequentially forming the first gate dielectric layer and a second initial gate dielectric layer on an inner wall of the gate groove;
    forming a first initial gate conductive layer in the gate groove with the first gate dielectric layer and the second initial gate dielectric layer;
    back etching the first initial gate conductive layer to expose part of the second initial gate dielectric layer and form the first gate conductive layer;
    forming a second initial gate conductive layer in the gate groove with the first gate conductive layer; and
    back etching the second initial gate conductive layer and the second initial gate dielectric layer to expose part of the first gate dielectric layer and form the second gate conductive layer and the second gate dielectric layer.

16. The method according to claim 15, wherein the method further comprises:
    forming a gate insulating layer on surfaces of the second gate dielectric layer and the gate conductive layer, wherein a top surface of the gate insulating layer is flush with a top surface of the substrate.

17. The method according to claim 13, wherein the substrate comprises a plurality of well regions; the gate structure is formed on a surface of the substrate between two adjacent well regions; and the gate structure comprises at least a first gate conductive layer and a second gate conductive layer, and the gate structure is formed by the following steps:
    sequentially forming a first initial gate dielectric layer, a second initial gate dielectric layer, a first initial gate conductive layer and a second initial gate conductive layer on the surface of the substrate from bottom to top; and
    sequentially etching the second initial gate conductive layer, the first initial gate conductive layer, the second initial gate dielectric layer, and the first initial gate dielectric layer through a mask with a preset window, to expose the well regions and form the second gate conductive layer, the first gate conductive layer, the second gate dielectric layer, and the first gate dielectric layer.

18. The method according to claim 13, wherein the substrate comprises a plurality of mutually isolated active columns and the gate structure comprises at least a first gate conductive layer and a second gate conductive layer, and the gate structure is formed around each of the active columns in the substrate; and the gate structure is formed by the following steps:
    sequentially forming a first initial gate dielectric layer, a second initial gate dielectric layer, a first initial gate conductive layer and a second initial gate conductive layer on a side wall of the active columns; and back etching the first initial gate dielectric layer, the second initial gate dielectric layer, the first initial gate conductive layer and the second initial gate conductive layer, to expose part of the active columns and form the first gate dielectric layer, the second gate dielectric layer, the first gate conductive layer and the second gate conductive layer.

\* \* \* \* \*